United States Patent
Merrill, Jr. et al.

(10) Patent No.: US 9,609,731 B2
(45) Date of Patent: Mar. 28, 2017

(54) SYSTEMS AND METHODS FOR SYNCHRONOUS OPERATION OF DEBRIS-MITIGATION DEVICES

(71) Applicant: Media Lario S.R.L., Bosisio Parini (IT)

(72) Inventors: Raymond Merrill, Jr., San Ramon, CA (US); Natale Ceglio, Pleasanton, CA (US); Daniel Stearns, Los Altos Hills, CA (US)

(73) Assignee: Media Lario SRL, Bosisio Parini (LC) (IT)

( * ) Notice: Subject to any disclaimer, the term of this patent is extended or adjusted under 35 U.S.C. 154(b) by 303 days.

(21) Appl. No.: 14/325,193

(22) Filed: Jul. 7, 2014

(65) Prior Publication Data

US 2016/0007435 A1  Jan. 7, 2016

(51) Int. Cl.
*H05G 2/00* (2006.01)
*G03F 7/20* (2006.01)

(52) U.S. Cl.
CPC .......... *H05G 2/008* (2013.01); *G03F 7/2039* (2013.01); *G03F 7/70033* (2013.01); *G03F 7/7055* (2013.01); *G03F 7/70166* (2013.01); *G03F 7/70175* (2013.01); *G03F 7/70916* (2013.01); *H05G 2/003* (2013.01); *H05G 2/005* (2013.01)

(58) Field of Classification Search
CPC ........ H05G 2/003; H05G 2/005; H05G 2/008; G03F 7/2039; G03F 7/70033; G03F 7/70166; G03F 7/70175; G03F 7/7055; G03F 7/70916
See application file for complete search history.

(56) References Cited

U.S. PATENT DOCUMENTS

| | | |
|---|---|---|
| 4,292,055 A | 9/1981 | de Castella et al. |
| 6,838,684 B2 | 1/2005 | Bakker et al. |
| 6,867,843 B2 | 3/2005 | Ogushi et al. |
| 6,963,071 B2 | 11/2005 | Bristol |
| 7,034,308 B2 | 4/2006 | Bakker et al. |
| 7,167,232 B2 * | 1/2007 | Banine ................ G03F 7/70916 250/492.1 |
| 7,302,043 B2 | 11/2007 | Bloom et al. |
| 7,317,196 B2 | 1/2008 | Partlo et al. |
| 7,355,190 B2 | 4/2008 | Bristol |
| 7,453,071 B2 | 11/2008 | Wassink |
| 7,612,353 B2 | 11/2009 | Sjmaenok et al. |
| 7,652,272 B2 | 1/2010 | Ruzic et al. |

(Continued)

*Primary Examiner* — Francis M Legasse, Jr.
(74) *Attorney, Agent, or Firm* — Opticus IP Law PLLC

(57) ABSTRACT

Systems and methods for synchronous operation of debris-mitigation devices (DMDs) in an EUV radiation source that emits EUV radiation and debris particles are disclosed. The methods include establishing a select relative angular orientation between the first and second DMDs that provides a maximum amount of transmission of EUV radiation between respective first and second rotatable vanes of the first and second DMDs. The methods also include rotating the first and second sets of vanes to capture at least some of the debris particles while substantially maintaining the select relative angular orientation. The systems employ DMD drive units, and an optical-based encoder disc in one of the DMD drive units measures and controls the rotational speed of the rotatable DMD vanes. Systems and methods for optimally aligning the DMDs are also disclosed.

9 Claims, 9 Drawing Sheets

(56) References Cited

U.S. PATENT DOCUMENTS

| | | |
|---|---|---|
| 7,655,925 B2 * | 2/2010 | Bykanov ............. G03F 7/70033 |
| | | 250/428 |
| 7,663,127 B2 | 2/2010 | Wood, II et al. |
| 7,671,349 B2 | 3/2010 | Bykanov et al. |
| 8,071,963 B2 | 12/2011 | Van Herpen et al. |
| 8,075,732 B2 | 12/2011 | Partlo et al. |
| 8,269,179 B2 | 9/2012 | Wassink et al. |
| 8,330,131 B2 | 12/2012 | Ceglio et al. |
| 8,338,797 B2 | 12/2012 | Derra et al. |
| 8,586,954 B2 | 11/2013 | Asayama et al. |
| 2013/0207004 A1 * | 8/2013 | Ceglio .................. G21K 1/067 |
| | | 250/504 R |
| 2013/0313423 A1 | 11/2013 | Umstadter |

* cited by examiner

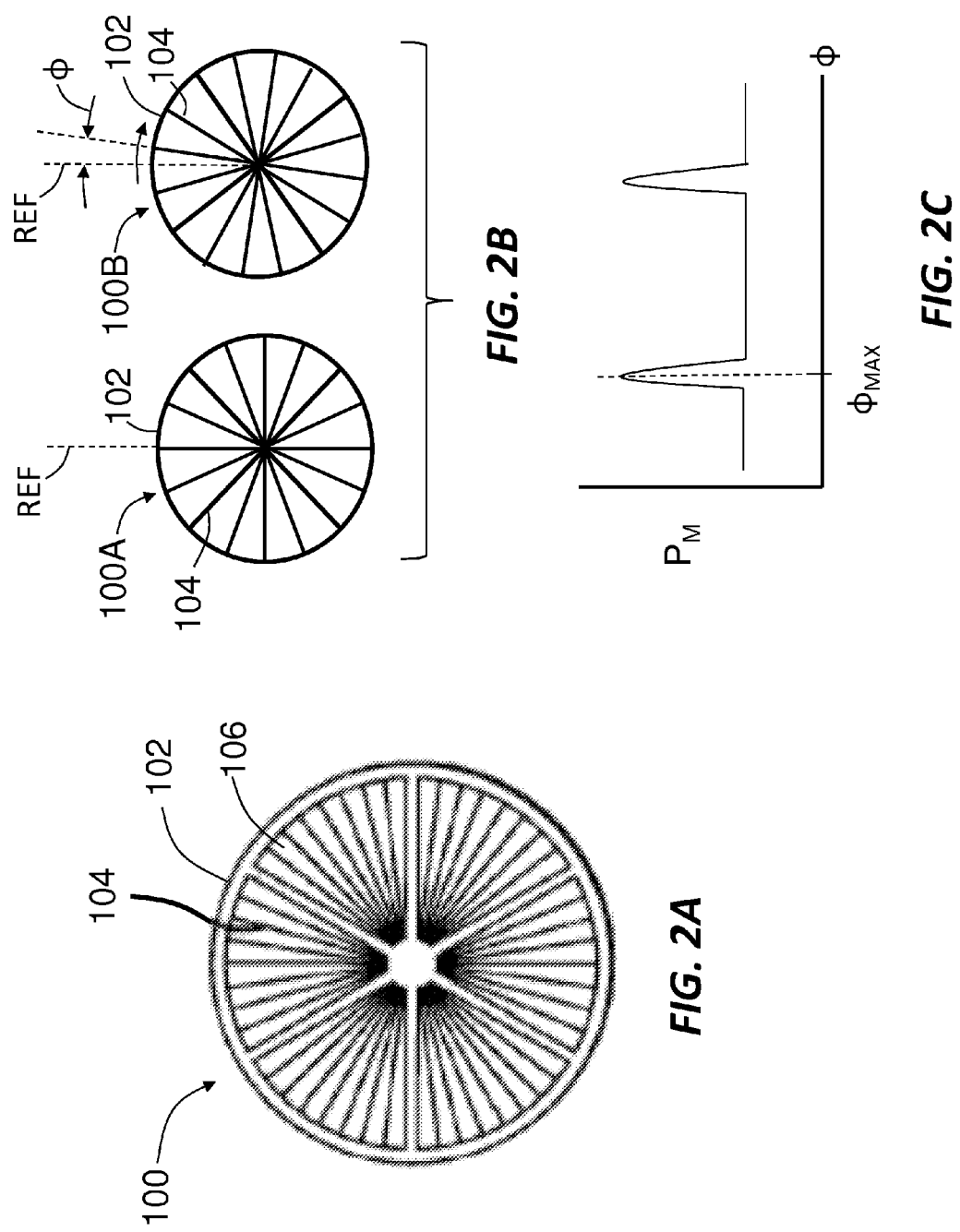

SYSTEMS AND METHODS FOR SYNCHRONOUS OPERATION OF DEBRIS-MITIGATION DEVICES

FIELD

The present disclosure relates to debris-mitigation devices such as are used in extreme-ultraviolet-lithography (EUVL) radiation sources, and in particular relates to systems and methods for the synchronous operation of debris-mitigation devices in EUV radiation sources to optimize the transmission of EUV radiation.

The entire disclosure of any publication or patent document mentioned herein is incorporated by reference, including the following: US2013/0207,004; U.S. Pat. Nos. 8,338,797; 7,302,043; 7,671,349; and U.S. Pat. No. 6,963,071.

BACKGROUND

Extreme-ultraviolet lithography (EUVL) involves employing an extreme-ultraviolet (EUV) radiation source that generates EUV radiation having a wavelength that is typically 13.5 nm+/−2%. The EUV radiation is directed to a reflective patterned mask to transfer the pattern onto a photoresist layer supported by a silicon wafer. The use of the small wavelengths associated with EUV radiation allows for the minimum feature size of the imaged pattern to also be small, i.e., as small as 15 nm and below.

Some EUV radiation sources involve the use of one or more lasers that direct respective laser beams to a fuel target to produce a hot plasma that generates the EUV radiation from an EUV emission location. The EUV radiation is collected by one or more collector mirrors and is then directed to an intermediate focus.

Unfortunately, the reaction that generates the EUV radiation also generates debris particles (e.g., ions, atoms and clusters of atoms) that can deposit on and into the surfaces of the one or more collector mirrors. The deposited debris particles adversely affect the mirror reflectance and thus reduce the performance of the EUV radiation source. This contamination of the collector mirrors can happen very rapidly (on the order of seconds) and can reduce the reflectivity of the collector-mirror surfaces to the point where the amount of EUV radiation available to a downstream illuminator is insufficient to perform the EUV exposure process.

To reduce the adverse effects of the collector contamination from the generated debris, it is known in the art to employ a debris-mitigation device (hereinafter, DMD). One type of DMD employs rotating vanes that intercept the debris particles as they travel toward the collector-mirror surface(s). Because the EUV radiation travels at the speed of light, the rotating vanes appear stationary for the purposes of transmitting the EUV radiation, during the transit time of the EUV radiation passing through the DMD. Thus, the reduction in transmission of the EUV radiation due to the vanes is a function of the cross-sectional area the vanes present to the EUV radiation. The reduction in the amount of contamination by the debris particles—which travel many orders of magnitude slower than the speed of light—is a function of the speed of the rotating vanes, their axial extent, the energy (speed) of the debris particles, and the architecture of the DMD, e.g., there may be rotating vanes followed by stationary vanes so that debris that does not "stick" to the vanes on the first encounter will be deflected and have an opportunity to "stick" in a subsequent encounter with a vane downstream.

SUMMARY

In the industrial application of EUV lithography, it is paramount to maximize the collection of EUV radiation from the EUV radiation source while minimizing the degradation of the collector optics by debris from the EUV target region. An aspect of the disclosure is coordinating the operation of two DMDs employed in an EUV radiation source so that the EUV radiation has optimum transmission from the EUV emission location and through both DMDs to the intermediate focus. One of the DMDs is operably arranged between the EUV radiation source and a normal-incidence collector (NIC), while the other DMD is operably arranged between the EUV radiation source and a grazing-incidence collector (GIC). The two DMDs are aligned and synchronized so that the effective loss of EUV radiation from the two DMDs is minimized. In one aspect of the methods disclosed herein, an EUV photon that passes twice through the DMD that resides adjacent the NIC will also pass through the DMD adjacent the GIC and then travel through the GIC and be directed to the intermediate focus IF.

An aspect of the disclosure is a method of operating first and second DMDs in an EUV radiation source that emits EUV radiation and debris particles. The method includes: establishing a select relative angular orientation between the first and second DMDs that provides a maximum amount of transmission of EUV radiation between respective first and second rotatable vanes of the first and second DMDs; and rotating the first and second sets of vanes to capture at least some of the debris particles while substantially maintaining the select relative angular orientation.

Another aspect of the disclosure is a system for performing debris mitigation in an EUV radiation source that emits EUV radiation and debris particles. The system includes: first and second DMDs respectively having first and second sets of rotatable vanes and operably arranged relative to the EUV radiation source so that the EUV radiation passes at least once through each of the first and second DMDs, wherein the first and second sets of vanes have a select relative angular orientation that provides a maximum amount of transmission of EUV radiation through the first and second DMDs; first and second drive units respectively operably connected to the first and second sets of vanes; and a controller operably connected to the first and second drive units and configured to control the first and second drive units to substantially maintain the select relative angular orientation during rotation of the first and second sets of vanes to capture at least some of the debris particles.

Another aspect of the disclosure is an EUV source system that includes the system as described immediately above and further includes: a fuel target delivered to an irradiation location; at least one laser that generates a laser beam that irradiates the fuel target to emit the EUV radiation and the debris particles; a GIC arranged adjacent the irradiation location and arranged to receive the EUV radiation and direct the EUV radiation to an intermediate focus; and an NIC defined by a spherical mirror having a focus at the irradiation location and arranged relative to the irradiation location opposite the GIC mirror so that the spherical mirror receives and reflects EUV radiation back to the irradiation location and then to the GIC mirror for redirecting to the intermediate focus.

Another aspect of the disclosure is an EUV source system for an EUV lithography system that includes along an optical axis: an irradiation location to which a Sn target is provided; a GIC having an input end adjacent the irradiation location, an output end, and an intermediate focus adjacent the output end; a spherical mirror arranged along the optical axis adjacent the irradiation location opposite the GIC and having a focus; at least one laser operably arranged to generate a pulsed beam of IR radiation to the irradiation location to irradiate the Sn target provided to the irradiation location to form a plasma having an EUV-emitting region that substantially isotropically emits EUV radiation and that also emits debris particles; a first DMD having a first set of rotatable vanes and operably arranged between the plasma and the GIC; a second DMD having a second set of rotatable vanes and operably arranged between the plasma and the spherical mirror; wherein the focus of the spherical mirror is located at the EUV-emitting region of the plasma so that a portion of the emitted EUV radiation passes through the second DMD and is received by the spherical mirror and is reflected therefrom back through the second DMD to the EUV-emitting region and then through the first DMD to the input end of the GIC; wherein the first and second sets of rotatable vanes have a select alignment that optimizes transmission of the portion of the emitted EUV radiation that travels through the first and second DMDs; and a DMD synchronization system operably connected to the first and second DMDs and configured to synchronize the rotation of the first and second sets of rotatable vanes to maintain the select alignment of the first and second sets of rotatable vanes of the first and second DMDs.

Another aspect of the disclosure is a method of monitoring the operation of a DMD that has a plurality of rotating vanes when the DMD is employed in an EUV source system that generates EUV radiation and debris particles. The method includes: monitoring a rotational speed of rotating vanes during operation of the EUV source system; determining a change in the rotational speed of the rotating vanes due to an accumulation of debris particles on the rotating vanes; comparing the change in the rotational speed to a preset change tolerance; and terminating the rotation of the rotating vanes when the change in rotational speed exceeds the preset change tolerance.

Additional features and advantages are set forth in the Detailed Description that follows and in part will be readily apparent to those skilled in the art from the description or recognized by practicing the embodiments as described in the written description and claims hereof, as well as the appended drawings. It is to be understood that both the foregoing general description and the following Detailed Description are merely exemplary and are intended to provide an overview or framework to understand the nature and character of the claims.

BRIEF DESCRIPTION OF THE DRAWINGS

The accompanying drawings are included to provide a further understanding and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which:

FIG. 2A is a front-on view of an example DMD showing the set of rotating vanes;

FIG. 2B is a front-on view of an example of the two DMDs of the EUV source of FIGS. 1A and 1B, illustrating the angular offset of one DMD versus the other with respect to a reference position;

FIG. 2C is a schematic plot of the measured optical power $P_M$ versus the angular offset $\phi$, showing how the angular rotation of one DMD relative to the other results in peaks in the transmitted power to the IF when the DMDs are properly aligned;

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute a part of this Detailed Description.

Figure 1A:
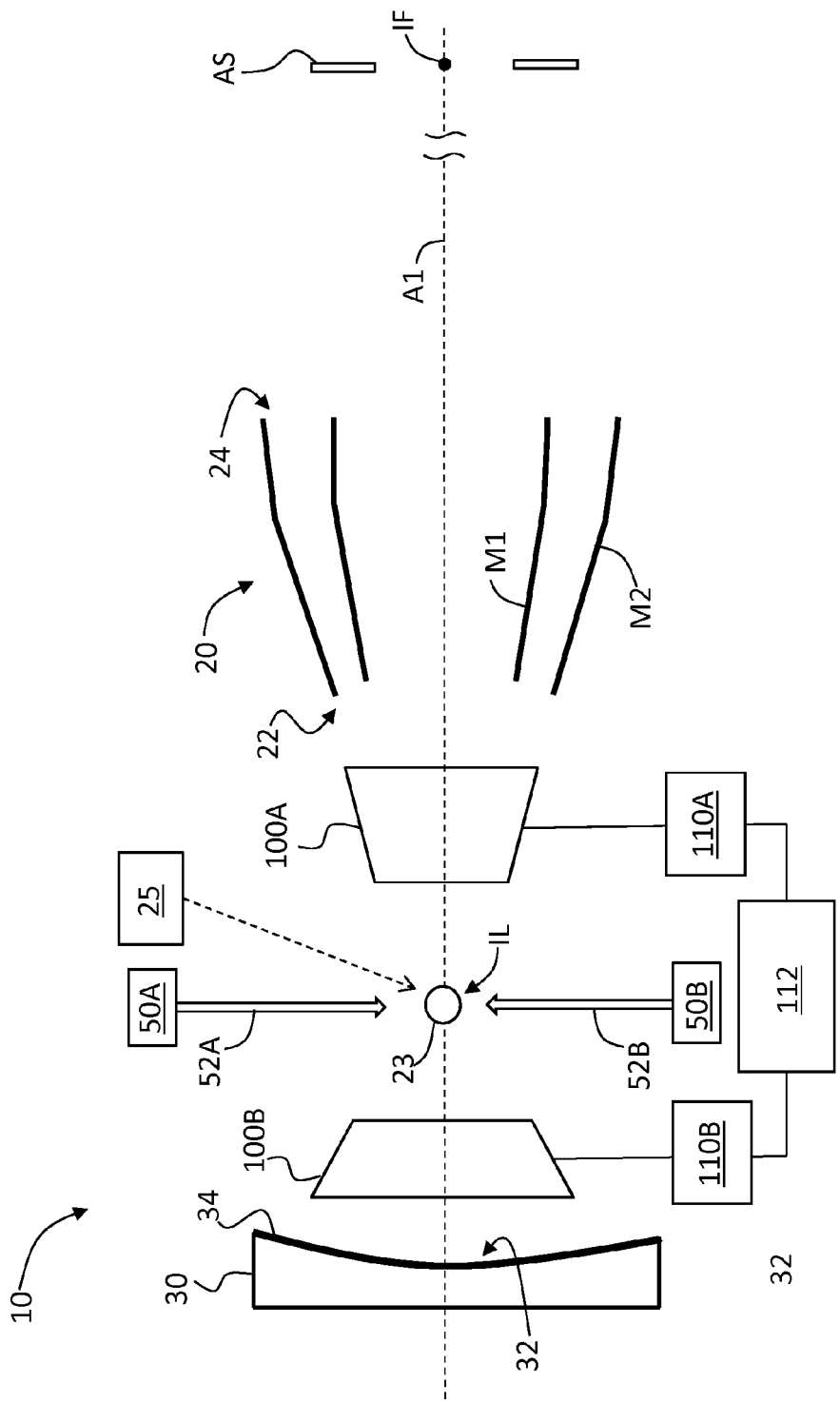
FIG. 1A is a schematic diagram of an example EUV source system prior to the laser beams hitting the fuel target.
Figure 1B:
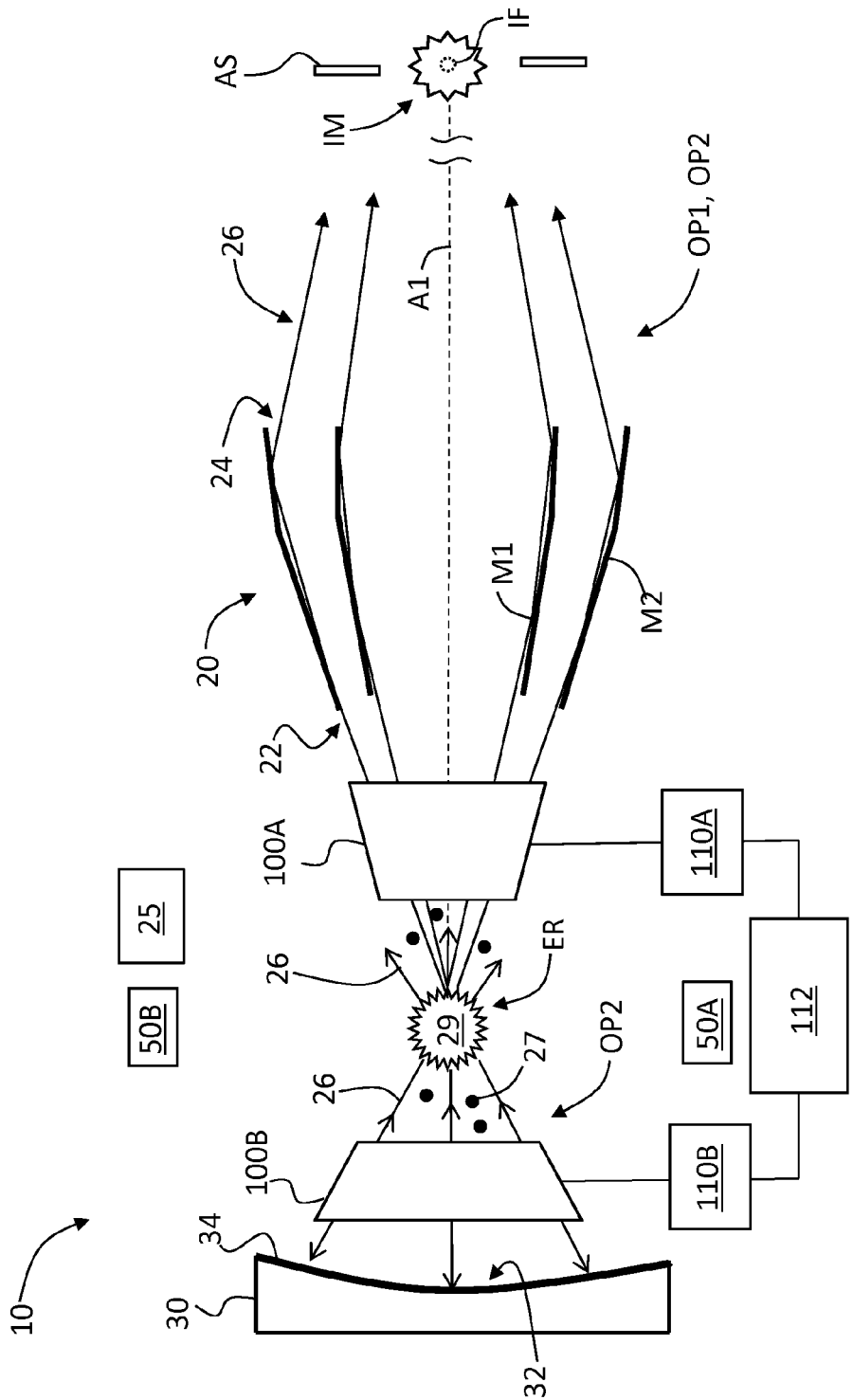
FIG. 1B is similar to FIG. 1A but shows the system in the state of operation when the laser beams hit the fuel target to create an EUV plasma that generates EUV radiation.

FIGS. 1A and 1B are schematic diagrams of an example EUV radiation source system ("system") 10 just prior to the emission of EUV radiation 26 and during the emission of the EUV radiation, respectively. The system 10 includes an axis A1 along which is operably arranged a grazing-incidence collector (GIC) 20 that includes an input end 22 and an output end 24. The GIC 20 also includes one or more nested grazing-incidence mirrors, and two such mirrors M1 and M2 are shown by way of example.

The system 10 also includes a normal-incidence collector (NIC) mirror 30 having a mirror surface 32 that includes a multi-layer reflective coating 34. In an example, NIC mirror 30 is spherical and has a focus at an irradiation location IL. The input end 22 of GIC 20 is arranged relative to and has a proximal focus at irradiation location IL and also has adjacent output end 24 an intermediate focus IF located at or near an aperture stop AS.

The EUV radiation source system 10 includes at least one laser 50, and two such lasers 50A and 50B are shown by way of example. The lasers 50A and 50B respectively emit laser beams 52A and 52B that are directed to a fuel target 23 provided at irradiation location IL by a fuel-target delivery system 25. The fuel target 23 may be, for example, a tin (Sn) droplet, and in particular may be a low-mass tin droplet that is substantially vaporized and ionized when irradiated by laser beams 52A and 52B.

The system 10 also includes at least one debris-mitigation device (DMD) 100. In the example shown in FIGS. 1A and 1B, system 10 includes first and second DMDs 100, denoted 100A and 100B. The first DMD 100A is operably disposed between irradiation location IL and input end 22 of GIC 20. The second DMD 100B is operably disposed between irradiation location IL and NIC mirror 30. Example forms of first and second DMDs 100A and 100B are discussed in greater detail below. The first and second DMDs 100A and 100B are respectively operably connected to DMD drive units 110 (denoted 110A and 110B), which in turn are operably connected to a controller 112.

The controller 112 can be any programmable device used in the art, such as a computer, micro-controller, FPGA, etc. that can be configured to control the operation of system 10 to perform the methods disclosed herein. In an example, controller 112 includes hardware and software that is configurable to define, in combination with other system components, one or more control loops, such as phase-lock loops, proportional-integral-derivative loops, and other types of feed-back-based loops. In an example, controller 112 includes instructions embodied in a computer-readable medium that cause the controller to carry out its control functions, including control-loop functions, signal processing, etc. In an example, system 10 includes more than one controller 112.

FIG. 1B shows the state of operation of system 10 after laser beams 52A and 52B are incident upon fuel target 23 of FIG. 1A. The result of the laser irradiation of fuel target 23 is the formation of an EUV plasma 29 that isotropically emits EUV radiation 26 as well as debris particles 27 (e.g., ions and atoms of the fuel material) from an emission region ER located substantially at irradiation location IL.

A first portion of EUV radiation 26 emitted by EUV plasma 29 travels through first DMD 100A and is collected by GIC 20 at input end 22 and undergoes a grazing incidence reflection at the GIC surface at least once. This grazingly reflected EUV radiation 26 is directed by GIC 20 to intermediate focus IF to form an intermediate image IM. The first portion of EUV radiation 26 thus defines a first optical path OP1 from emission region ER to intermediate focus IF.

Another portion of EUV radiation 26 emitted by EUV plasma 29 is envisioned to initially travel in the opposite direction of the first portion and through second DMD 100B to NIC mirror 30 over a second optical path OP2. This EUV radiation 26 reflects from NIC surface 32 and travels back through second DMD 100B over substantially the same second optical path OP2 back to emission region ER—because the shape of NIC mirror 30 is a sphere with its center at the emission region—so that radiation from the emission region is reflected by the NIC surface back onto itself. This EUV radiation 26 then continues along first optical path OP1 as if, like the first portion of EUV radiation, it were initially emitted from emission region ER.

Thus, a portion of second optical path OP2 overlaps first optical path OP1 so that the second portion of EUV radiation 26 also travels through first DMD 100A to GIC 20 and then to intermediate focus IF, thereby contributing to the formation of intermediate image IM. Since EUV radiation 26 travels at the speed of light, the vanes of the two DMDs 100A, 100B are essentially stationary during the passage of the EUV radiation through the DMD regions. Thus it is of particular importance for the optimization of the debris-mitigation process that the first and second optical paths OP1 and OP2 overlap when traveling through first DMD 100A, as described below.

FIG. 2A is a front-on view of an example DMD 100. The DMD 100 includes a housing 102 that operably supports a set of vanes 104 that are rotatable within the housing about a central axis. The vanes 104 define a plurality of apertures 106 through which the EUV radiation 26 can pass. An example DMD 100 is disclosed in U.S. Pub. No. 2012/0305810. The rotation of vanes 104 in DMD 100 serves to prevent the surfaces of mirrors M1 and M2 of GIC 20 from being coated by debris particles 27. The vanes 104 intercept debris particles 27. The rotating vanes 104 thus serve to sweep out a substantial portion of debris particles 27 before they reach GIC 20 and NIC mirror 30.

The material of vanes 104 can block EUV radiation 26 and so represents a source of attenuation for the EUV. The rotating vanes 104 are thus preferably thin (in the transverse direction, i.e., in the θ rotational direction) to minimize the amount of EUV radiation 26 that is blocked by the vane edges (e.g., thin enough so that they block no more than 20% of the EUV radiation) and longer in the axial direction to maximize the interception and capture of the slower moving debris particles 27.

The first and second DMDs 100A and 100B define respective attenuations $AT_A$ and $AT_B$ of EUV radiation 26 due to their respective cross-sectional areas defined by vanes 104. In the case where DMDs 100A and 100B have identical vane configurations (at least with respect to thickness and number), then $AT_A = AT_B$. For ease of discussion, it is assumed that vanes 104 of DMDs 100A and 100B are similar to the point where $AT_A = AT_B = AT$.

If vanes 104 in the two DMDs 100A and 100B are identical and aligned (e.g., both open at the same time), then the second portion of EUV radiation 26 that travels over the double-pass optical path OP2 through second DMD 100B experiences only a single attenuation from the vanes therein when passing through the DMDs. This is because EUV radiation 26 travels at the speed of light and thus makes the round-trip over second optical path OP2 in a time so short that vanes 104 have no appreciable movement. Any blockage of the second portion of EUV radiation 26 by vanes 104 in second DMD 100B occurs only on the first passage of the second portion of the EUV radiation through the second DMD.

An example DMD 100 can have about 180 vanes 104 that are each 0.1 mm wide in the azimuthal direction. This DMD 100 can be used to reduce the number of fast debris particles 27 (e.g., particles traveling at about $2.5 \times 10^5$ cm/s) with vanes 104 that are 25 cm long in the axial direction and have rotational speeds of about 3,300 RPM. (In another example rotating vanes 104 that are 10 cm long will require a rotational frequency of about 8,300 RPM to achieve the same debris-mitigation performance.) This configuration for DMD 100 blocks about 15% of EUV radiation 26 just from its static shadow; and it will sweep out all debris particles 27 moving slower than about $2.5 \times 10^5$ cm/s. In an example, some vanes 104 can be made stationary and positioned downstream of other rotating vanes to enhance the collection of deflected debris particles 27.

DMD Synchronization

The first and second DMDs 100A and 100B can operate within system 10 without synchronization. In such operation, however, the unsynchronized rotation of vanes 104 of the two DMDs 100A and 100B will result in an overall increase in the EUV radiation attenuation compared to that of aligned and synchronized DMDs. That is because in the un-aligned and un-synchronized case EUV radiation 26 that is headed toward NIC mirror 30 will undergo the attenuation due to passage through DMD 100B and will then undergo an additional attenuation when passing through DMD 100A after its reflection from NIC mirror surface 32.

When the two DMDs 100A and 100B are aligned and synchronized for maximum transmission, EUV radiation 26 that is headed toward NIC mirror 30 will undergo the attenuation due to passage through DMD 100B but will undergo (none to minimal) additional attenuation when passing through DMD 100A after its reflection from NIC mirror surface 32. So, proper alignment and then synchronization (with feedback control to maintain the synchronicity) of the rotation of vanes 104 in first and second DMDs 100A and 100B can be used to limit the total DMD attenuation. Depending on the specific values of DMD alignment and transmissions, and on mirror collection solid angles and reflectivities, the aligned and synchronized condition can result (for typical system parameters) in an increased EUV power at intermediate focus IF of about 10% over the randomly un-aligned and un-synchronized case.

FIG. 2B is a front-on view of first and second DMDs 100A and 100B. The first DMD 100A is shown as being rotationally aligned to a reference position REF. The second DMD 100B is shown as having a rotation angle $\phi$ with respect to first DMD 100A. The example first and second DMDs are each shown as having 16 vanes 104 for ease of illustration. The 16 vanes 104 define 16 apertures 106. The 16 vanes 104 have angular separations of $2\pi/16=\pi/8$ radians. Thus, if first and second DMDs 100A and 100B start out rotationally aligned ($\phi=0$) and then one DMD is rotated by a rotation angle of $\phi=\pi/8$, the two DMDs return to being rotationally aligned. For N vanes 104, the rotation angle $\phi$ that returns the two DMDs 100A and 100B to alignment is $2\pi/N$.

In the case where one DMD has a different number of vanes 104, the rotation angle that returns the two DMDs 100A and 100B to alignment can be determined readily by knowing the particular configuration of each DMD. In either case, there will be a limited range of the rotation angle through with the two DMDs 100A and 100B can be rotated to achieve a select relative alignment.

FIG. 2C is a schematic plot of the measured optical power at intermediate focus IF versus the relative rotation angle $\phi$ between first and second DMDs 100A and 100B. The plot shows that there is a relative rotation angle $\phi$, denoted $\phi_{MAX}$, where the measured optical power is at a maximum. This occurs when vanes 104 of first and second DMDs 100A and 100B are aligned in a manner that provides minimum blockage of EUV radiation 26 over first and second optical paths OP1 and OP2. This angle for maximum transmitted optical power is not necessarily $\phi=0$. When first and second DMDs 100A and 100B are identical, then $\phi_{max}=2\pi/N$, where N is the number of vanes 104 in each of the two DMDs. How the select relative angular alignment of vanes 104 of first and second DMDs 100A and 100B is determined is discussed in greater detail below.

Figure 3:
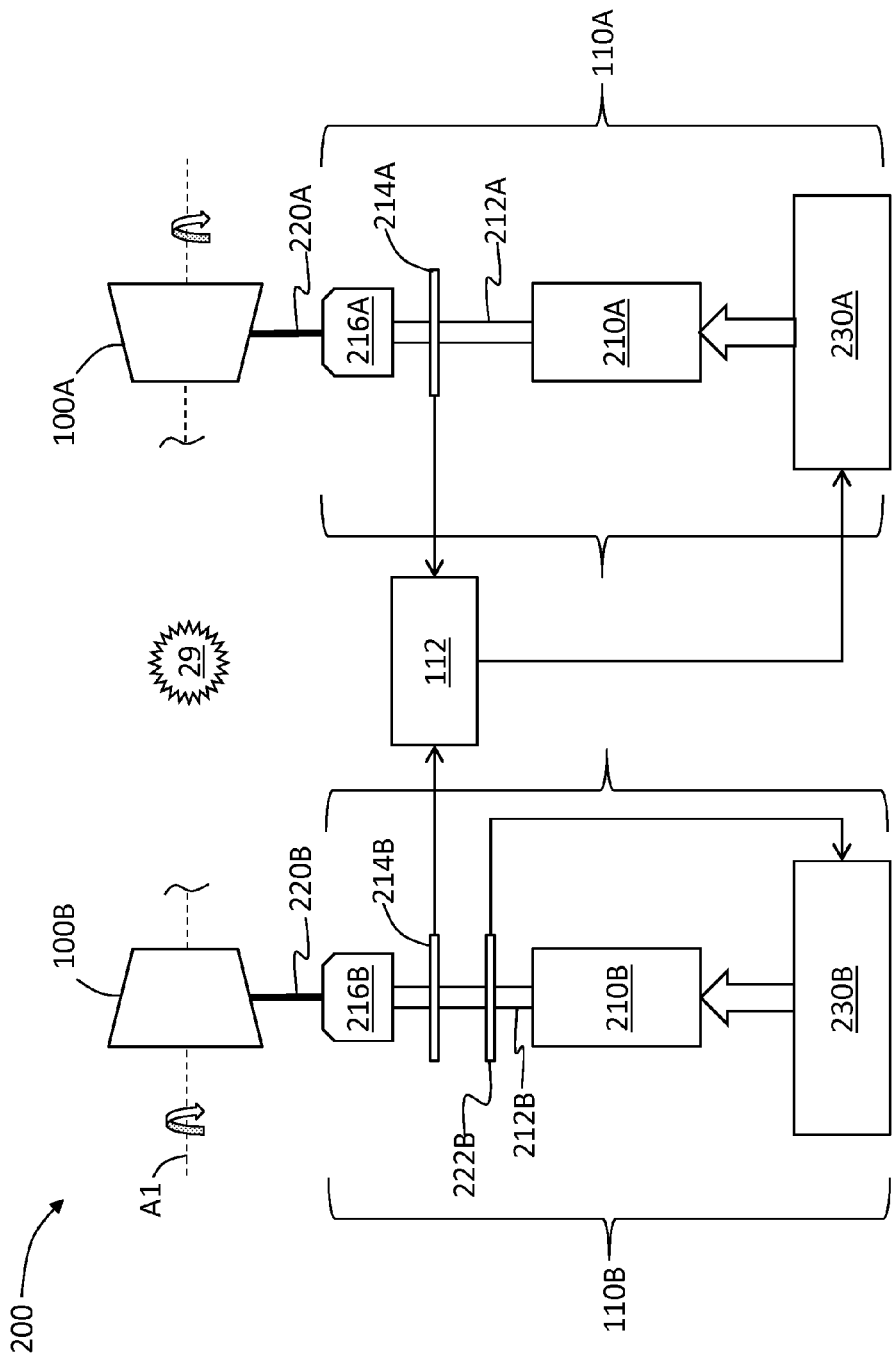
FIG. 3 is a schematic diagram of an example DMD synchronization system according to the disclosure.

FIG. 3 is a schematic diagram of an example DMD synchronization system 200 according to the disclosure. The DMD synchronization system 200 includes first and second DMDs 100A and 100B, the respective drive units 110A and 110B, and controller 112. The drive unit 110A includes a servo motor 210A operably connected to a drive shaft 212A to which is operably attached an angle encoder 214A. The drive shaft 212A leads to a transfer box 216A configured to drive a drive shaft 220A to drive the rotation of vanes 104 in DMD 100A about axis A1. The drive unit 110A also includes a drive amplifier 230A operably connected to servo motor 210A.

The drive unit 110B is configured essentially the same as drive unit 110A and includes a servo motor 210B, a drive shaft 212B, an angle encoder 214B, a transfer box 216B, and a drive shaft 220B. The drive unit 110B also includes a tachometer encoder 222B operably connected to drive shaft 212B. The drive unit 110B also includes a drive amplifier operably connected to servo motor 210B and to tachometer encoder 222B. The controller 112 of DMD synchronization system 200 includes or is otherwise configured as a phase-lock loop (PLL) that is electrically connected to the two angle encoders 214A and 214B and to drive amplifier 230A of drive unit 110A.

The configuration of DMD synchronization system 200 makes drive unit 110B the primary or master drive unit and drive unit 110A the secondary or slave drive unit. The master drive unit 110B operates as a constant-velocity tachometer loop, while secondary drive unit 110A operates as a synchronous phase loop.

The DMD synchronization system 200 is configured to maintain the relative angular locations of vanes 104 during the operation of first and second DMDs 100A and 100B so that the attenuation of EUV radiation 26 due to the vanes in both DMDs is minimized. This requires first determining the angular locations (relative to reference angular location REF) of vanes 104 of each of first and second DMDs 100A and 100B so that EUV radiation 26 that double-passes through the second DMD also passes through the first DMD. This can be accomplished by using a ray trace calculation of the kind that is known to one skilled in the art and that is available on most commercially available lens-design software programs. This can also be accomplished empirically, as discussed in greater detail below in connection with FIG. 8. The select alignment needs to be determined only once for the given configuration of system 10.

Once the optimum alignment of first and second DMDs 100A and 100B is established, the relative angular orientation of the DMDs needs to be tracked during the rotation of vanes 104 in each of the first and second DMDs. In the configuration of DMD synchronization system 200 of FIG. 3, this is accomplished by angle encoders 214A and 214B measuring the respective angular positions (i.e., first and second angular positions) of respective drive shafts 212A and 212B. The angular position information is then used to determine the respective rotational speeds of drive shafts 212A and 212B (e.g., using controller 112).

If the measured angular orientation shifts beyond a given angular tolerance, this gives rise to a phase error $\Delta\phi$. This phase error $\Delta\phi$ is provided to the PLL of controller 112. In response, controller 112 sends a control signal to drive amplifier 230A to change the speed of servo motor 210A to reduce the phase error $\Delta\phi$ (i.e., to drive $\Delta\phi$ to zero) to bring the relative angular orientations of first and second DMDs 100A and 100B back within the angular tolerance.

Example Angle Encoder

Figure 4:
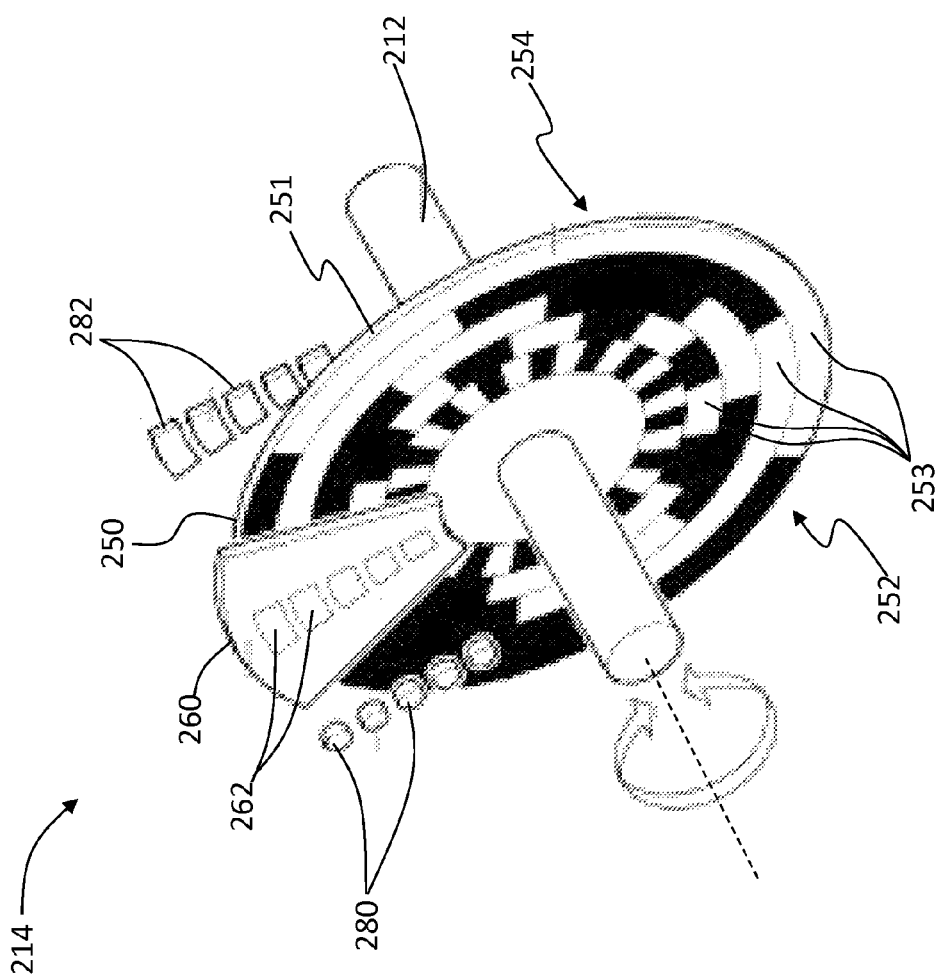
FIG. 4 is a close-up elevated view of an example angle encoder according to the disclosure.

FIG. 4 is a close-up elevated view of an example angle encoder 214. The angle encoder 214 includes an encoder disc 250 that has a perimeter 251 and front and back surfaces 252 and 254. The encoder disc 250 is configured to rotate with drive shaft 212. A capture plate 260 is operably arranged relative to front surface 252 and perimeter 251 of encoder disc 250 and defines a number of apertures 262 relative to radial positions on the encoder disc. A plurality of light sources 280 and a corresponding plurality of photodetectors 282 are respectively radially arranged adjacent front and back surfaces 252 and 254 of encoder disc 250 so that light source and photodetector pairs are in optical communication through respective apertures 262 and through the encoder disc.

Figure 5:
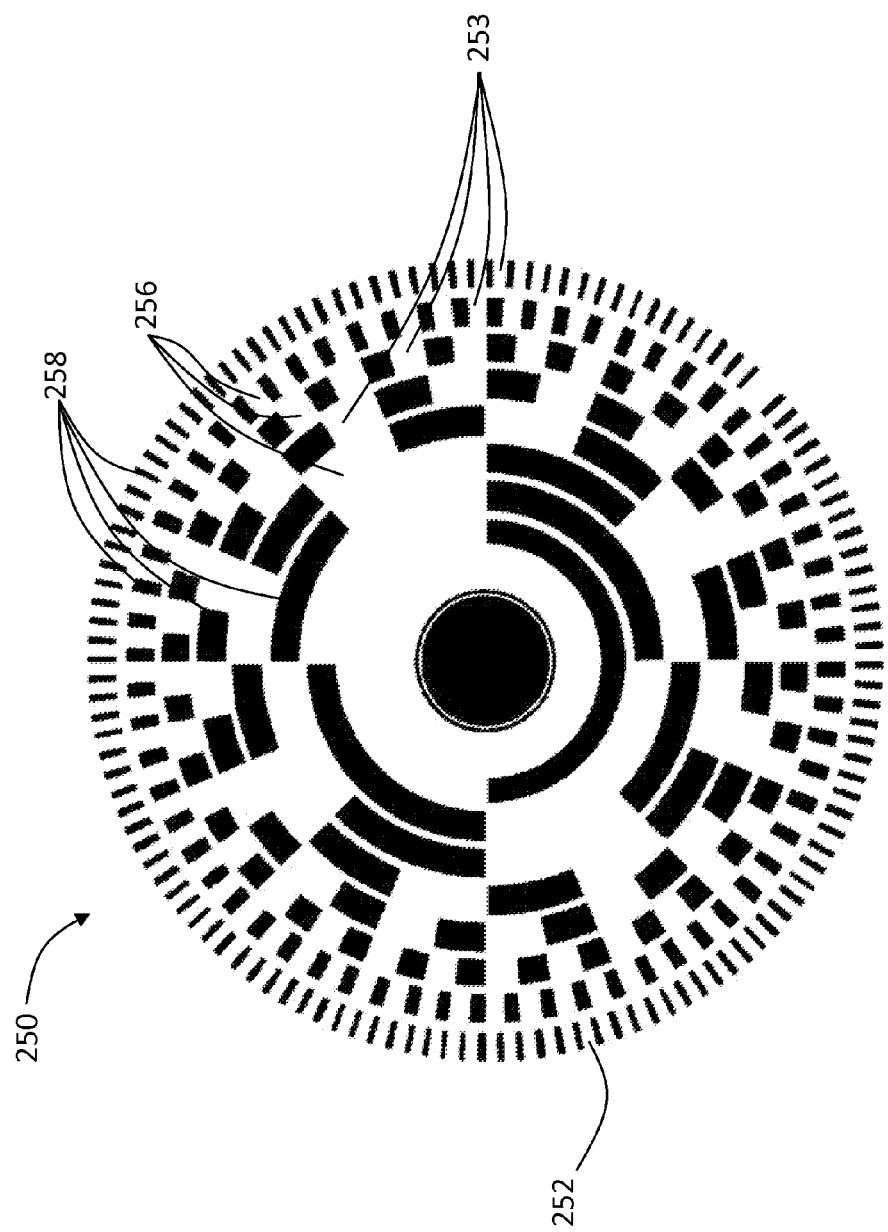
FIG. 5 is a front-on view of an example encoder disc for the angle encoder of FIG. 4.

FIG. 5 is a front-on view of an example encoder disc 250. The encoder disc 250 includes annular sections 253 that each includes a periodic array of transmissive regions 256 and opaque regions 258. The periodicity of transmissive regions 256 and opaque regions 258 of annular sections 253 increases with the radius of the encoder disc 250. The example encoder disc 250 includes eight annular regions 253, with the size of transmissive regions 256 and opaque regions 258 decreasing by a factor of two for each annular region moving from the center outward. Thus, annular sections 253 are binary encoded with binary optical transmission patterns that increase in periodicity with the radius.

The annular regions 253 are radially aligned with light sources 280 and corresponding photodetectors 282 so that light from a given light source has to pass through an intervening annular region. Because encoder disc 250 spins relative to the stationary light sources 280 and their corresponding detectors 282, transmissive regions 256 and opaque regions 258 give rise to a modulation that is radially dependent. This allows for dynamic coarse-to-fine angular measurement resolutions and the absolute tracking of DMDs 100 and vanes 104 therein.

Drive Shaft Synchronization

An aspect of the disclosure involves providing rotational synchronization between drive shafts 212A and 212B, which are mechanically isolated and motor driven by separate servo motors 210A and 210B. As noted above, the primary or master drive unit 110B is configured in a speed control loop using tachometer encoder 222B. The tachometer encoder 222B is sensitive only to rotational speed. A drive amplifier 230B can be configured in a standard proportional control loop with tachometer encoder 222B providing feedback. As an alternative, a proportion integral-derivative (PID) loop configuration can be implemented.

Figure 6:
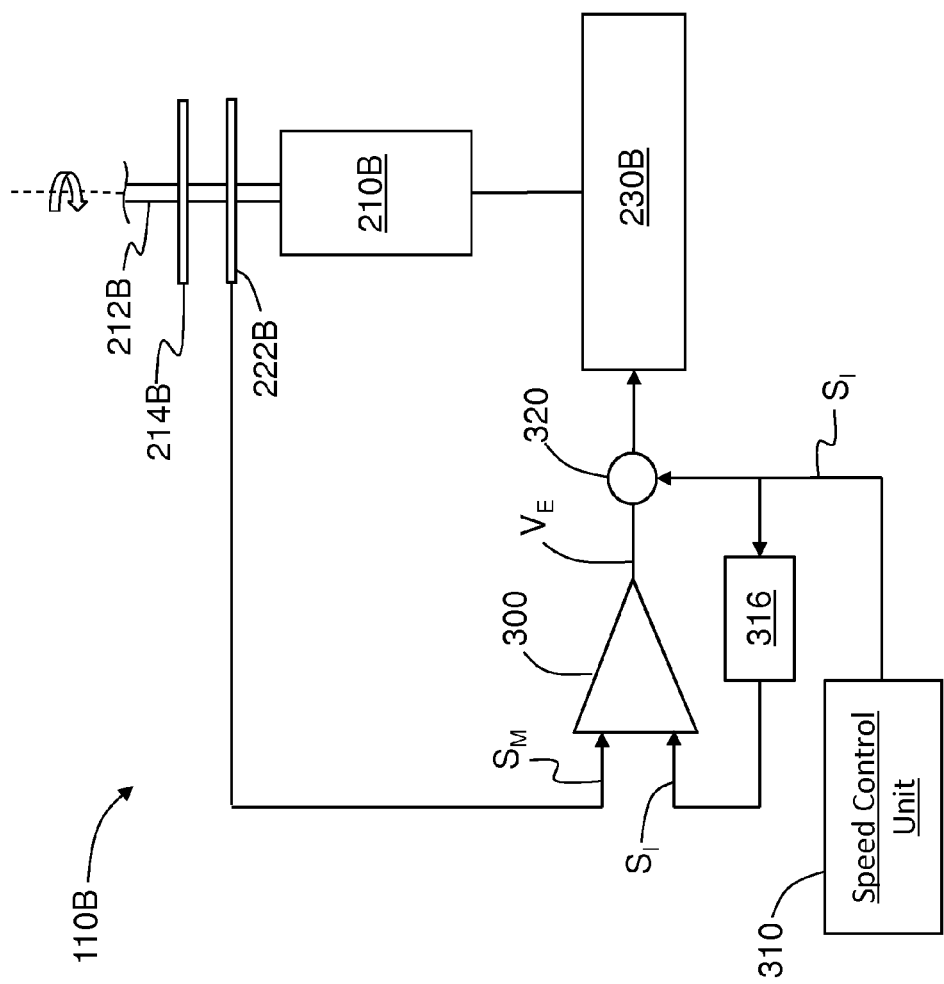
FIG. 6 is a close-up and more detailed schematic diagram of the master drive unit of the DMD synchronization system of FIG. 3.

FIG. 6 is a close-up and more detailed schematic diagram of master drive unit 110B of DMD synchronization system 200 of FIG. 3 and shows more details about how the master drive unit maintains the rotation rate of DMD vanes 104 at a constant speed in a control loop configuration. In the example shown, tachometer encoder 222B measures the rotational speed $S_M$ of drive shaft 212B. Here, it is assumed that this rotational speed is the same as or is directly proportional to the rotational speed of vanes 104 in DMD 100B (e.g., via the operation of transfer box 216B). The measured rotational speed $S_M$ is provided as one input to a comparator 300. A speed control unit 310 is used to provide an input rotational speed $S_I$. This input rotational speed $S_I$ is provided to a set-point unit 316 that provides an input voltage to the other input of comparator 300. The comparator 300 provides an output error voltage signal $V_E$ representative of the difference between the measured rotational speed $S_M$ and the input (desired) rotational speed $S_I$. The error voltage $V_E$ and input speed $S_I$ are combined at 320 and provided to drive amplifier 230B, which changes the speed of servo motor 210B to correct for the measured error in the rotational speed to maintain the rotational speed at the input speed $S_I$.

Thus, the configuration of master drive unit 110B defines a control loop that maintains servo motor 210B at a set rotational speed even under varying load conditions, such as when vanes 104 accumulate debris particles 27 and become heavier. As an alternative, a PID loop can be used.

Single DMD Monitoring

It is noted that an aspect of the disclosure is directed to monitoring the angular rotation and phase of a single DMD 100 using angle encoder 214. This monitoring can be useful because rotating vanes 104 can become loaded with debris 27 (e.g., condensed Sn). This could load servo motor 210 and lead to rotational instability of the rapidly rotating vanes 104. Thus, the methods described herein including monitoring and maintaining the speed of a single (master) DMD 100 in the embodiment where only a single DMD is used. Such an embodiment may be for an example system 10 where GIC 20 is the only collector (i.e., no NIC mirror 30 is used).

In an example, the error voltage signal $V_E$ is monitored for the single DMD 100 during the operation of system 10. When the error voltage $V_E$ exceeds a preset value or tolerance (e.g., due to debris accumulation on vanes 104 of the single DMD 100), a warning message (e.g., "maintenance required," or "service" or the like) can be generated by controller 112 and the DMD serviced. In an example, when the change in the rotational speed of vanes 104 exceeds the present change tolerance, the operation of DMD 100 is terminated (i.e., the rotation of the vanes is terminated) to avoid damaging the DMD and/or DMD drive unit 110.

DMD Synchronization with Phase-Lock Loop

Figure 7:
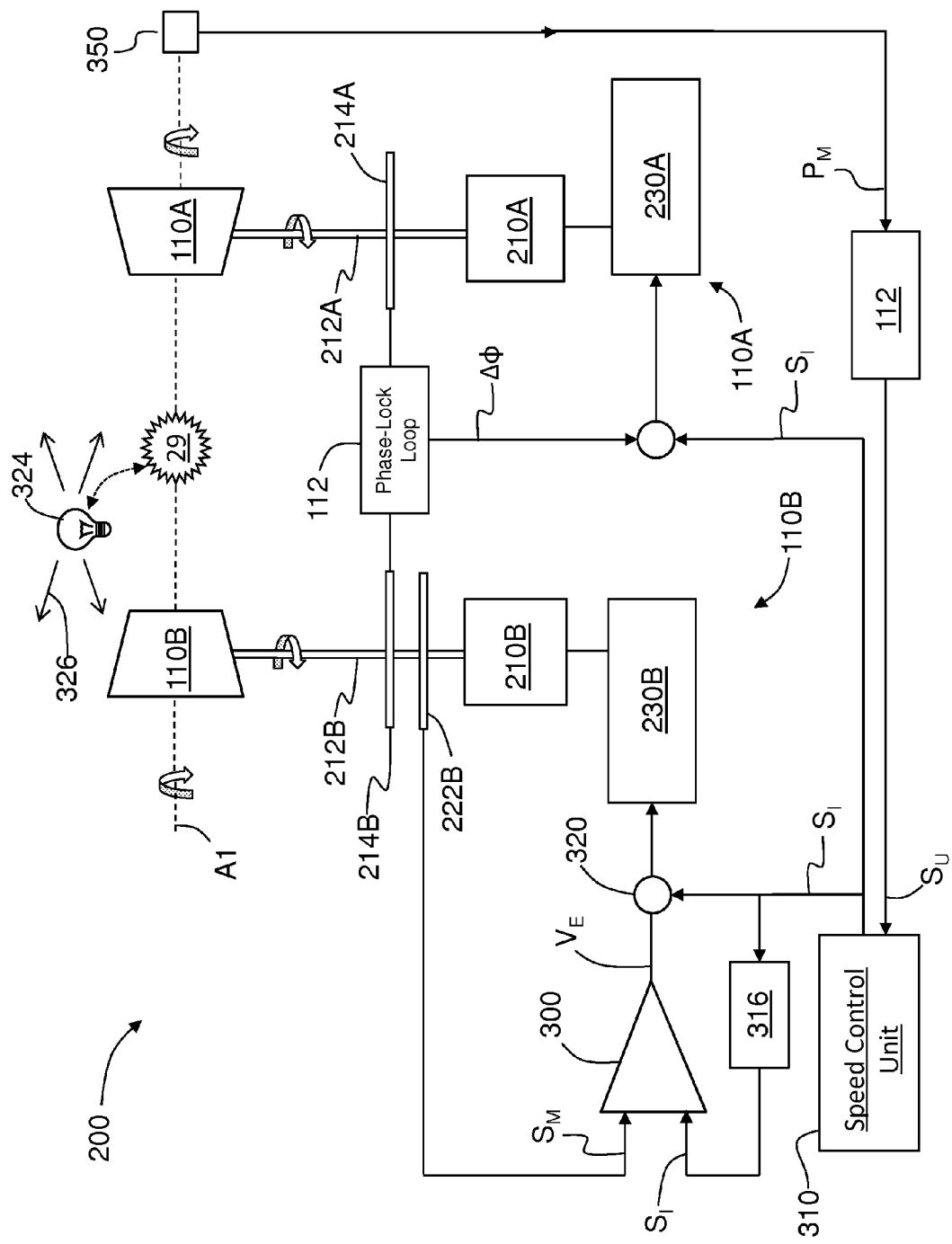
FIG. 7 is a schematic diagram of the DMD synchronization system similar to that of FIG. 6 but also including the slave drive unit, and also illustrating an example configuration for performing system calibration.

FIG. 7 is similar to FIG. 6 and adds secondary or slave drive unit 110A. Synchronizing master drive unit 110B and slave drive unit 110A can be accomplished by creating an angular position feedback system using binary encoders or analog resolvers. As illustrated in FIG. 7, controller 112 has a phase-lock loop (PLL) that provides the measured angular phase error $\Delta\phi$ to slave drive unit 110A to synchronize the angular position with that of master drive unit 110B. Thus, servo motor 230B of master drive unit 110B is driven at a constant speed and the control loop is used to adjust the speed of servo motor 230A of slave drive unit 110A as needed to maintain the angular phase error $\Delta\phi$ within a select tolerance, and in an example at $\Delta\phi=0$.

An example aspect of using DMD synchronization system 200 can include performing an alignment and calibration procedure assembly to align angle encoders 214 and to set the loop coefficients to match loading. The drive and loop circuitry can be designed such that most calibrations and alignments can be done electronically by means of offset and gain parameters. This can enhance computer control capabilities as well.

In the example illustrated in FIG. 7, an additional optical or radiant energy feedback control loop may be implemented to perform system calibration and help stabilize the exposure energy and also to inform system 200 when vanes 104 are attenuating too much of EUV radiation 26 energy due to debris build up or are otherwise creating attenuation beyond an expected value. In an example, a detector 350 is operably arranged within system 200 so it that can measure the optical power $P_M$ at a convenient position downstream of first DMD 100A. The signal from detector 350 representative of the measured power $P_M$ can be fed to controller 112 and then processed to provide updated speed control information SU to speed control unit 310. This feedback mechanism can be used to assist in optimizing the transmission of EUV radiation 26 through DMDs 100A and 100B and to intermediate focus IF.

Establishing a Select DMD Alignment

As discussed above, a select alignment of first and second DMDs 100A and 100B that provides optimum transmission of EUV radiation 26 through the DMDs needs to be established prior to operating system 10. In an example, this can be performed by measuring the optical power $P_M$ with detector 350 while adjusting the relative rotation angle $\phi$ of first and second DMDs 100A and 100B. The rotation angle $\phi$ that provides a maximum measured power $P_M$ can be used as the angle that provides the select alignment.

It is also noted that the above method for determining a select alignment can be done with a radiation source other than EUV plasma 29. Because system 10 is a mirror-based system, it has no chromatic aberration. Consequently, an alternate light source 324 that emits light 326 of a different wavelength (e.g., such as a visible wavelength) or a broad range of wavelengths can be used in place of EUV plasma 29 to determine the select alignment. The alternative light source 324 should be one that, like EUV plasma 29, allows for light traveling over optical path OP2 to pass through it. Thus, light source 324 can be incandescent, a flame, another type of plasma, fluorescent, one or more LEDs, etc.

Integrated DMD Synchronization System

Figure 8:
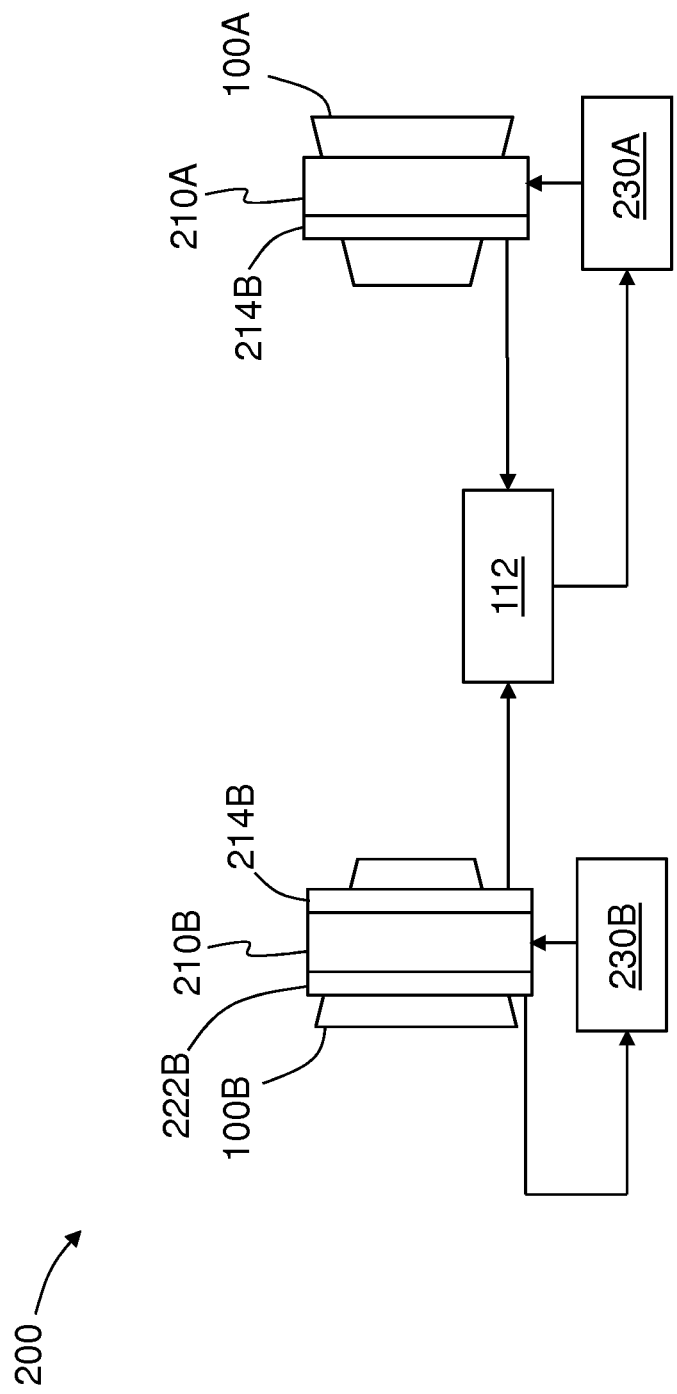
FIG. 8 is a schematic diagram of an example DMD synchronization system according to the disclosure wherein the servo motors, the angle encoders and the tachometer encoder are integrated with their respective DMDs.

FIG. 8 is a schematic diagram that illustrates an alternate embodiment of DMD synchronization system 200 that shows a configuration where servo motors 210A and 210B are integrated with their corresponding DMDs 100A and 100B in a manner that eliminates the need for drive shafts 212 and 220. The tachometer encoder 222B and angle encoders 214A and 214B are also integrated into their respective servo motors.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A method of operating first and second debris-mitigation devices (DMDs) in an extreme-ultraviolet (EUV) radiation source that emits EUV radiation and debris particles, comprising:
   establishing a select relative angular orientation between the first and second DMDs that provides a maximum amount of transmission of EUV radiation between respective first and second rotatable vanes of the first and second DMDs;
   rotating the first and second sets of vanes to capture at least some of the debris particles while substantially maintaining the select relative angular orientation; and
   wherein a variation from the select relative angular orientation defines a phase error, and wherein maintaining the select relative angular orientation is based on a measurement of the phase error.

2. The method according to claim 1, further including:
   rotating the first set of vanes at a first speed that is substantially constant; and
   rotating the second set of vanes at a second speed that is adjustable to reduce the phase error.

3. The method according to claim 2, further comprising using the phase error in a control loop when adjusting the second speed of the second set of vanes.

4. The method according to claim 1, including determining first and second rotational speeds of the first and second sets of vanes using first and second angular position information from first and second angle encoders.

5. The method according to claim 4, wherein the first and second angle encoders comprise respective first and second binary encoders, with each of the first and second binary encoders having an encoder disc with annular binary optical transmission patterns with periods that increase with the radius of the encoder disc.

6. The method according to claim 1, wherein the rotating of the first and second sets of vanes is accomplished by respective first and second servo motors that include respective first and second drive shafts that are operably connected to the first and second sets of vanes.

7. A method of monitoring the operation of a debris-mitigation device (DMD) that has a plurality of rotating vanes when employed in an extreme-ultraviolet (EUV) source system that generates EUV radiation and debris particles, comprising:
   monitoring a rotational speed of rotating vanes during operation of the EUV source system;
   determining a change in the rotational speed of the rotating vanes due to an accumulation of debris particles on the rotating vanes;
   comparing the change in the rotational speed to a preset change tolerance; and
   terminating the rotation of the rotating vanes when the change in rotational speed exceeds the preset change tolerance.

8. The method of claim 7, wherein the change in the rotational speed of the rotating vanes is measured as a voltage, and wherein the preset change tolerance is provided as an error voltage.

9. The method of claim 7, further including generating a warning message when the change in rotational speed exceeds the preset change tolerance.

* * * * *